United States Patent
Buckalew et al.

(10) Patent No.: US 12,331,421 B2
(45) Date of Patent: Jun. 17, 2025

(54) EDGE REMOVAL FOR THROUGH-RESIST PLATING IN AN ELECTRO-PLATING CUP ASSEMBLY

(71) Applicant: Lam Research Corporation, Fremont, CA (US)

(72) Inventors: Bryan L. Buckalew, Tualatin, OR (US); Stephen J. Banik, Happy Valley, OR (US)

(73) Assignee: Lam Research Corporation, Fremont, CA (US)

( * ) Notice: Subject to any disclaimer, the term of this patent is extended or adjusted under 35 U.S.C. 154(b) by 312 days.

(21) Appl. No.: 17/779,828

(22) PCT Filed: Nov. 24, 2020

(86) PCT No.: PCT/US2020/062111
§ 371 (c)(1),
(2) Date: May 25, 2022

(87) PCT Pub. No.: WO2021/108466
PCT Pub. Date: Jun. 3, 2021

(65) Prior Publication Data
US 2023/0012414 A1 Jan. 12, 2023

Related U.S. Application Data

(60) Provisional application No. 62/941,519, filed on Nov. 27, 2019.

(51) Int. Cl.
*C25D 17/06* (2006.01)
*H01L 23/00* (2006.01)

(52) U.S. Cl.
CPC .............. *C25D 17/06* (2013.01); *H01L 24/02* (2013.01); *H01L 2224/02313* (2013.01);
(Continued)

(58) Field of Classification Search
CPC . H01L 2924/01027; H01L 2924/01028; H01L 2924/01029; H01L 2924/01047;
(Continued)

(56) References Cited

U.S. PATENT DOCUMENTS 5,516,412 A * 5/1996 Andricacos ............... C25F 7/00
204/224 R
7,012,333 B2 * 3/2006 Shimoyama ............ H01L 24/11
257/772
(Continued)

FOREIGN PATENT DOCUMENTS

| CN | 1433487 | 7/2003 |
| CN | 1636267 | 7/2005 |

(Continued)

OTHER PUBLICATIONS

Chinese Application Serial No. 202080082283.2, Response filed May 20, 2024 to Office Action mailed Jan. 20, 2024, w/ current English claims, 3 pgs.

(Continued)

*Primary Examiner* — Marcos D. Pizarro
*Assistant Examiner* — Tiberiu Dan Onuta
(74) *Attorney, Agent, or Firm* — Schwegman Lundberg & Woessner, P.A.

(57) ABSTRACT

An electroplating cup assembly comprises a cup bottom, a lip seal, and an electrical contact structure. The cup bottom at least partially defines an opening configured to allow exposure of a wafer positioned in the cup assembly to an electroplating solution. The lip seal is on the cup bottom and comprises a sealing structure extending upwardly along an inner edge of the lip seal to a peak that is configured to be in contact with a seed layer of a wafer and adjacent to a sacrificial layer of the wafer. The electrical contact structure (Continued)

is over a portion of the seal. The electrical contact structure configured to be coupled to the seed layer of the wafer.

14 Claims, 9 Drawing Sheets

(52) U.S. Cl.
CPC .............. *H01L 2224/0239* (2013.01); *H01L 2924/01027* (2013.01); *H01L 2924/01028* (2013.01); *H01L 2924/01029* (2013.01); *H01L 2924/01047* (2013.01); *H01L 2924/0105* (2013.01); *H01L 2924/0132* (2013.01)

(58) Field of Classification Search
CPC ..... H01L 2924/0105; H01L 2924/0132; H01L 21/288; H01L 21/2885; H01L 24/02; H01L 2224/02313; H01L 2224/0239; C25D 17/06; C25D 17/001; C25D 17/004; C25D 17/005; C25D 5/022; C25D 7/123
See application file for complete search history.

(56) References Cited

U.S. PATENT DOCUMENTS

| | | | | |
|---|---|---|---|---|
| 7,232,513 | B1* | 6/2007 | Webb | C25D 3/38 205/296 |
| 2002/0064729 | A1* | 5/2002 | Ching | H01L 21/2885 430/311 |
| 2003/0085119 | A1 | 5/2003 | Davis et al. | |
| 2004/0055893 | A1 | 3/2004 | Lubomirsky et al. | |
| 2004/0187303 | A1 | 9/2004 | Laplante et al. | |
| 2011/0233056 | A1 | 9/2011 | Rash et al. | |
| 2015/0348772 | A1* | 12/2015 | Kolics | H01L 21/76873 204/224 R |
| 2016/0201212 | A1 | 7/2016 | Ostrowski et al. | |

FOREIGN PATENT DOCUMENTS

| | | |
|---|---|---|
| CN | 101176040 | 5/2008 |
| CN | 102412196 | 4/2012 |
| CN | 103350983 | 10/2013 |
| CN | 105088177 | 11/2015 |
| CN | 105132979 | 12/2015 |
| CN | 106337199 | 1/2017 |
| CN | 107208295 | 9/2017 |
| CN | 107208299 | 9/2017 |
| CN | 107254702 A | 10/2017 |
| CN | 108531953 | 9/2018 |
| CN | 114729466 | 7/2022 |
| JP | 2004068151 A | 3/2004 |
| JP | 2016135912 | 7/2016 |
| JP | 2023504033 | 2/2023 |
| KR | 100792338 B1 | 1/2008 |
| TW | 200408081 | 5/2004 |
| TW | 201900940 A | 1/2019 |

OTHER PUBLICATIONS

Taiwanese Application Serial No. 109141550, Office Action mailed Jun. 17, 2024, with machine translation, 29 pgs.
International Application Serial No. PCT/US2020/062111, International Search Report mailed Mar. 9, 2021, 3 pgs.
International Application Serial No. PCT/US2020/062111, Written Opinion mailed Mar. 9, 2021, 5 pgs.
"International Application Serial No. PCT US2020 062111, International Preliminary Report on Patentability mailed Jun. 9, 2022", 7 pgs.
"Chinese Application Serial No. 202080082283.2, Office Action mailed Jan. 20, 2024", W Machine English Translation, 21 pgs.
Chinese Application Serial No. 202080082283.2, Response to Examiner Telephone Call filed Jul. 31, 2024, w/ English claims, 3 pgs.
Taiwanese Application Serial No. 109141550, Response filed Sep. 16, 2024 to Office Action mailed Jun. 17, 2024, w/ English claims (not amended), 3 pgs.

* cited by examiner

EDGE REMOVAL FOR THROUGH-RESIST PLATING IN AN ELECTRO-PLATING CUP ASSEMBLY

The present application is a U.S. National Stage Filing under 35 U.S.C. 371 from International Application No. PCT/US2020/062111, filed on Nov. 24, 2020, and published as WO 2021/108466 A1 on Jun. 3, 2021, which claims priority to U.S. Provisional Patent Application No. 62/941, 519, filed Nov. 27, 2019, each of which is herein incorporated by reference in its entirety.

BACKGROUND

Electroplating is commonly used in integrated circuit manufacturing processes to form electrically conductive structures. For example, in a copper damascene process, electroplating is used to form copper lines and vias within channels previously etched into a dielectric layer. In such a process, a seed layer of copper is first deposited into the channels and on the substrate surface via physical vapor deposition. Then, electroplating is used to deposit a thicker copper layer over the seed layer such that the channels are completely filled. Excess copper is then removed by chemical mechanical polishing, thereby forming the individual copper features.

Current electroplating systems may be classified as "open contact" and "closed contact." Open contact plating systems are systems in which the wafer contacts that deliver electric current to the seed layer during plating are exposed to the plating solution. Likewise, closed contact plating systems are those in which the contacts are not exposed to the plating solution.

When fabricating integrated circuits, it is generally desirable to utilize as much wafer surface as possible for the fabrication of devices to increase a quantity of devices per wafer. However, electroplating systems generally utilize electrical contacts and other structures that contact the wafer during deposition. Therefore, a limited amount of surface area can be plated. For example, in open contact plating systems, because the electrodes are exposed to the plating solution during a plating process, the electrodes are plated to the substrate surface during the process. Removal of the electrodes exposes unplated regions where the electrodes contacted the substrate. Further, removal of the contacts may cause damage to the copper layer in the vicinity of the electrodes. For example, 2 mm or more of the outer perimeter of the wafer may become unsuitable for integrated circuit fabrication.

Existing RDL technology uses nominal seed thickness (1000 A-3000 A). These thicknesses are vulnerable to CD loss, line roughness, and undercut during the long, aggressive seed etch process. Attempts to enable thin-seed plating to less than 1000 A (e.g., 50, 100, 200, 400 A) in order to reduce etch time have focused largely on anode tuning (size, shape, number) to control current distribution. These changes are far from the wafer surface and tend to result in global correction. As such, they cannot achieve the local correction needed for terminal effect, and often result in wavy, non-uniform current (and subsequent plating thickness) profiles.

FIG. 1 illustrates a sectional view of an electroplating cup assembly 100 in accordance with a prior art. A lip seal of an electroplating system is coupled to a perimeter of the wafer and adjacent to an outermost yielding feature. Electroplating using the electroplating cup assembly 100 typically results in larger thickness plating at the wafer edge relative to the surface of the wafer because of the "terminal effect." The terminal effect occurs when the seed resistance dominates the plating bath equivalent circuit and results in significant electrodeposition at the wafer edge relative to the surface of the wafer.

BRIEF DESCRIPTION OF THE SEVERAL VIEWS OF THE DRAWINGS

To easily identify the discussion of any particular element or act, the most significant digit or digits in a reference number refer to the figure number in which that element is first introduced.

DETAILED DESCRIPTION

Figure 1:
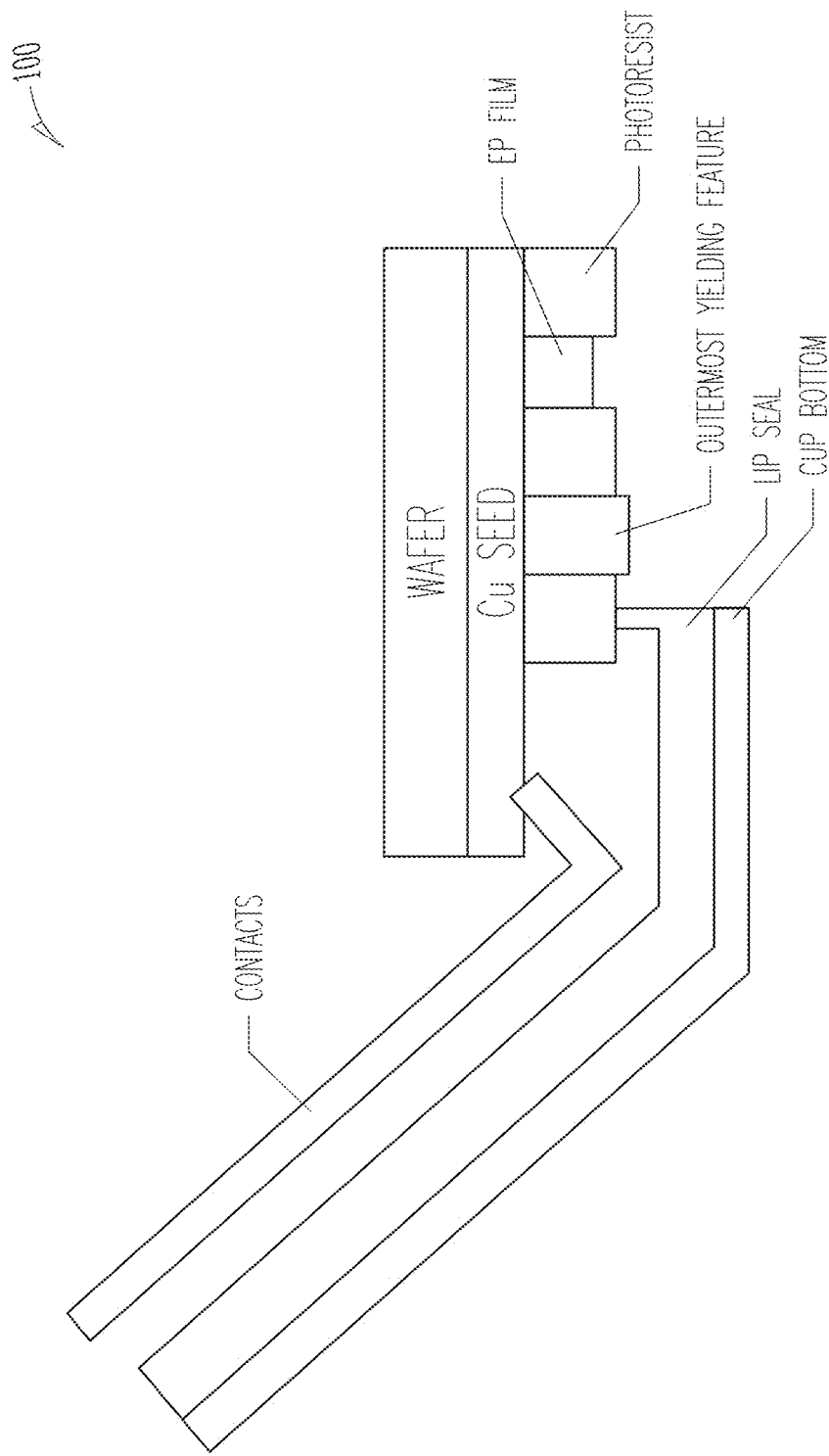
FIG. 1 illustrates a sectional view of an electroplating cup assembly 100 in accordance with a prior art.

The description that follows describes systems, methods, techniques, instruction sequences that illustrate example embodiments of the present subject matter. In the following description, for purposes of explanation, numerous specific details are set forth in order to provide an understanding of various embodiments of the present subject matter. It will be evident, however, to those skilled in the art, that embodiments of the present subject matter may be practiced without some or other of these specific details. Examples merely typify possible variations. Unless explicitly stated otherwise, structures (e.g., structural components, such as modules) are optional and may be combined or subdivided, and operations (e.g., in a procedure, algorithm, or other function) may vary in sequence or be combined or subdivided.

The term "wafer" is used herein to refer to a semiconductor substrate. An example of a wafer includes a slice of crystalline silicon.

The term "electroplating solution" is used herein to refer to an electrolyte solution used for plating a metal.

The term "lip seal" is used herein to refer to a radial shaft seal.

The term "edge-bevel removal (EBR) tool" is used herein to refer to a tool/system used for removal a bevel edge of a wafer. Wafers have two typical edge types: a slanted beveled shape or a rounded bullet shape. The edges on the beveled types are referred to as the bevel region. In one example, EBR is a process that using sulfuric acid and hydrogen peroxide to remove the edge and back side metal layer.

Fine-line redistribution layer (RDL), a component of an advanced packaging scheme "High density fan-out, or HDFO" is gaining interest as packages trend toward smaller and thinner footprints. Several challenges are associated with fine-line RDL, particularly during the seed etch removal step in the semi-additive process (SAP). Namely, critical dimension (CD) loss, i.e., line shrinkage, sidewall roughness evolution, and undercut as the copper etchant attacks both the underlying seed and line itself. One possible route to address these challenges is to reduce the underlying copper seed thickness on which the lines are plated. Thinner seed requires less etch time and can utilize less aggressive seed etch chemistries.

Thin-seed plating, however, has its own challenges, primarily a phenomenon called "terminal effect." Terminal effect occurs when the potential drop across the thin metal seed (which is more resistive than thick metal seeds) leads to thick plating near the wafer edge (at the contact terminals) than at the wafer center.

While CIRP (Channeled Ionic Resistive Plate), (also known as a HRVA or High Resistance Virtual Anode) helps mitigate terminal effect, it alone is not sufficient for ultrathin seeds. The present system described herein addresses these challenges. The present application describes a thin-seed plating process that includes coupling an optimized CIRP and anode shield with a new cup+lipseal design during an electroplating process. A post-plating EBR (Edge Bevel Removal) process is performed after the electroplating process to remove a sacrificial plated ring. Whereas traditional cups and lipseals are designed to cover the exposed copper seed at the wafer perimeter to prevent corrosion and plating, one embodiment intentionally exposes a portion of the seed. With this region exposed, copper can plate in an annular ring shape at the wafer edge. Thieving current from the features in close proximity to this ring reduces the plated thickness. This sacrificial ring can compensate for and corrects the terminal effect.

The present application can also includes a post-plating step in which the sacrificial ring of plated copper can be removed. Electrochemical deposition tools such as (SABRE and SABRE3D of Lam Research Inc.) can be equipped with an optional EBR (edge-bevel removal) module to remove Cu deposited on the bevel region of the wafer (as it can affect downstream processing if left intact). While wafer level packaging (WLP) typically does not use EBR (it is used by Damascene and Thru Silicon Via (TSV)), the present system described herein can re-purpose this module for removal of the sacrificial copper ring. EBR time, chemistry, and edge exclusion size can be optimized for this process. Without removal of this thick sacrificial plated copper ring, downstream processes (e.g., wafer dicing) can be compromised.

In a first embodiment that targets thin-seed plating of Cu for RDL applications, the present system is applicable to: a) Any thin-seed (<1000 A) through-resist Cu plating application, not specifically RDL, and b) Nominal seed thickness (1000 A to 3000 A) with large pattern exclusion. The large pattern exclusion can be defined here as a region at the edge of the wafer larger than 0.5 mm in width where photoresist has been applied, but not patterned. Photoresist that is not patterned will not be plated and thus regions of pattern adjacent to large regions of non-pattern tend to plate with an abrupt thickness spike and thus and edge-uptick is formed.

In a second embodiment, instead of copper, the process of sacrificial plating and removal can be extended to any metal (Ni, SnAg, Sn, Co). The EBR process can be modified from a piranha etch (which is used for Cu etching in the first embodiment) to a nitric etch or other chemical etch tailored to the metal that will be etched.

In one example embodiment, an electroplating cup assembly is described. The electroplating cup assembly includes a cup bottom (that has an opening), and a seal disposed on the cup bottom around the opening. The seal includes a wafer-contacting peak located substantially at an inner edge of the seal. The electroplating cup assembly also includes an electrical contact structure disposed over a portion of the seal.

In one example embodiment, the electroplating cup assembly includes: a cup bottom at least partially defining an opening configured to allow exposure of a wafer positioned in the electroplating cup assembly to an electroplating solution; a lip seal coupled to the cup bottom. The lip seal includes a sealing structure that extends upwardly along an inner edge of the lip seal to a peak that is configured to be in contact with a seed layer of the wafer and a sacrificial layer of the wafer; and an electrical contact structure that forms a seal with the lip seal, the electrical contact structure configured to be coupled with the seed layer of at a perimeter of the wafer.

In another example embodiment, a method for electroplating a wafer is described. The method includes: disposing a wafer on an electroplating cup assembly that exposes a surface of the wafer to an electroplating solution, the surface comprising a sacrificial layer at a perimeter of the wafer; electroplating the exposed surface of the wafer; and removing the plated sacrificial layer of the wafer after electroplating the exposed surface of the wafer.

In yet another example embodiment, a system for electroplating a wafer is described. The system includes: a wafer comprising a seed layer and a sacrificial layer, the sacrificial layer being disposed along a perimeter of the wafer on the seed layer; and an electroplating cup assembly configured to support the wafer. The electroplating cup assembly includes: a cup bottom at least partially defining an opening configured to allow exposure of the wafer positioned in the electroplating cup assembly to an electroplating solution; a lip seal coupled to the cup bottom, the lip seal comprising a sealing structure that extends upwardly along an inner edge of the lip seal to a peak that is configured to be in contact with the seed layer of the wafer and the sacrificial layer of the wafer; and an electrical contact structure that forms a seal with the lip seal, the electrical contact structure configured to be coupled with the seed layer of at the perimeter of the wafer.

Figure 2:
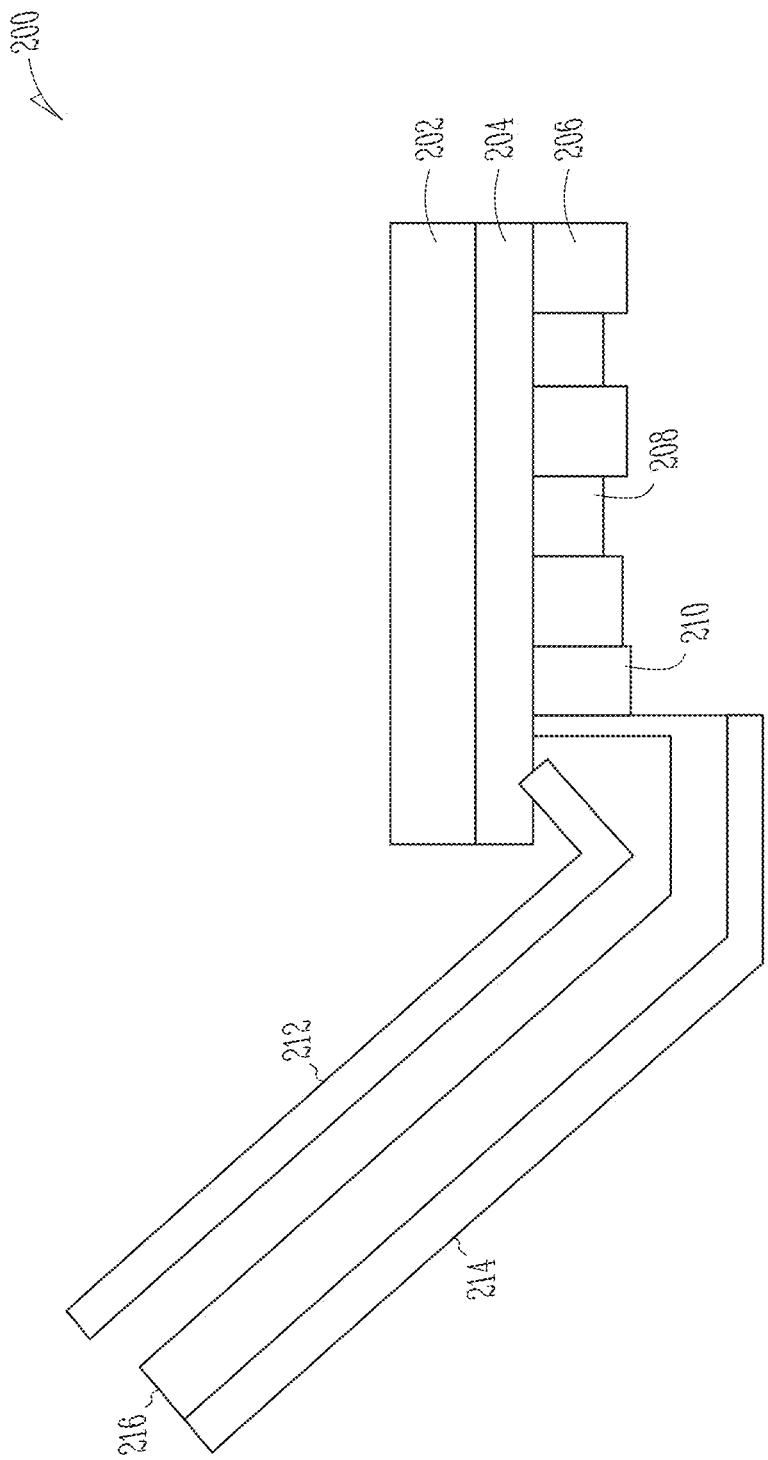
FIG. 2 illustrates a sectional view of an electroplating cup assembly 200 in accordance with one embodiment.

FIG. 2 illustrates a sectional view of an electroplating cup assembly 200 in accordance with one embodiment. The electroplating cup assembly 200 can include a wafer 202, a seed layer (e.g., copper seed 204), a photoresist 206, an outermost yielding feature 208, a sacrificial layer 210 (e.g., sacrificial EP film), an electrical contact structure 212, a cup bottom 214, and a lip seal 216. By intentionally exposing a portion of the seed layer at the wafer perimeter to plate a sacrificial annular region/ring of copper (e.g., sacrificial layer 210), current can be thieved from features in close proximity (e.g., within 5 nm to 10 nm) to the wafer edge, reducing their plated thickness. This sacrificial ring compensates for and corrects terminal effect.

The cup bottom 214 can at least partially define an opening configured to allow exposure of a portion of the surface of the wafer 202 positioned in the electroplating cup assembly to an electroplating solution. For example, the exposed portion of the wafer 202 can include the sacrificial layer 210, outermost yielding feature 208, and the photoresist 206. The exposed portion of the wafer 202 is exposed to the electroplating solution.

The lip seal 216 is coupled to the cup bottom 214. The lip seal 216 includes a sealing structure that extends upwardly along an inner edge of the lip seal 216 to a peak that is configured to be in contact with the copper seed 204 of the wafer 202. The sealing structure is adjacent to the sacrificial layer 210. For example, the sealing structure is in contact with a vertical surface of the sacrificial layer 210 of the wafer 202.

The electrical contact structure 212 is in contact with the copper seed 204 of at a perimeter of the wafer 202 and forms a seal with the lip seal 216. For example, the surface area protected by the seal (e.g., edges of the wafer 202 and the back of the wafer 202) is not exposed to the electroplating solution.

Figure 3:
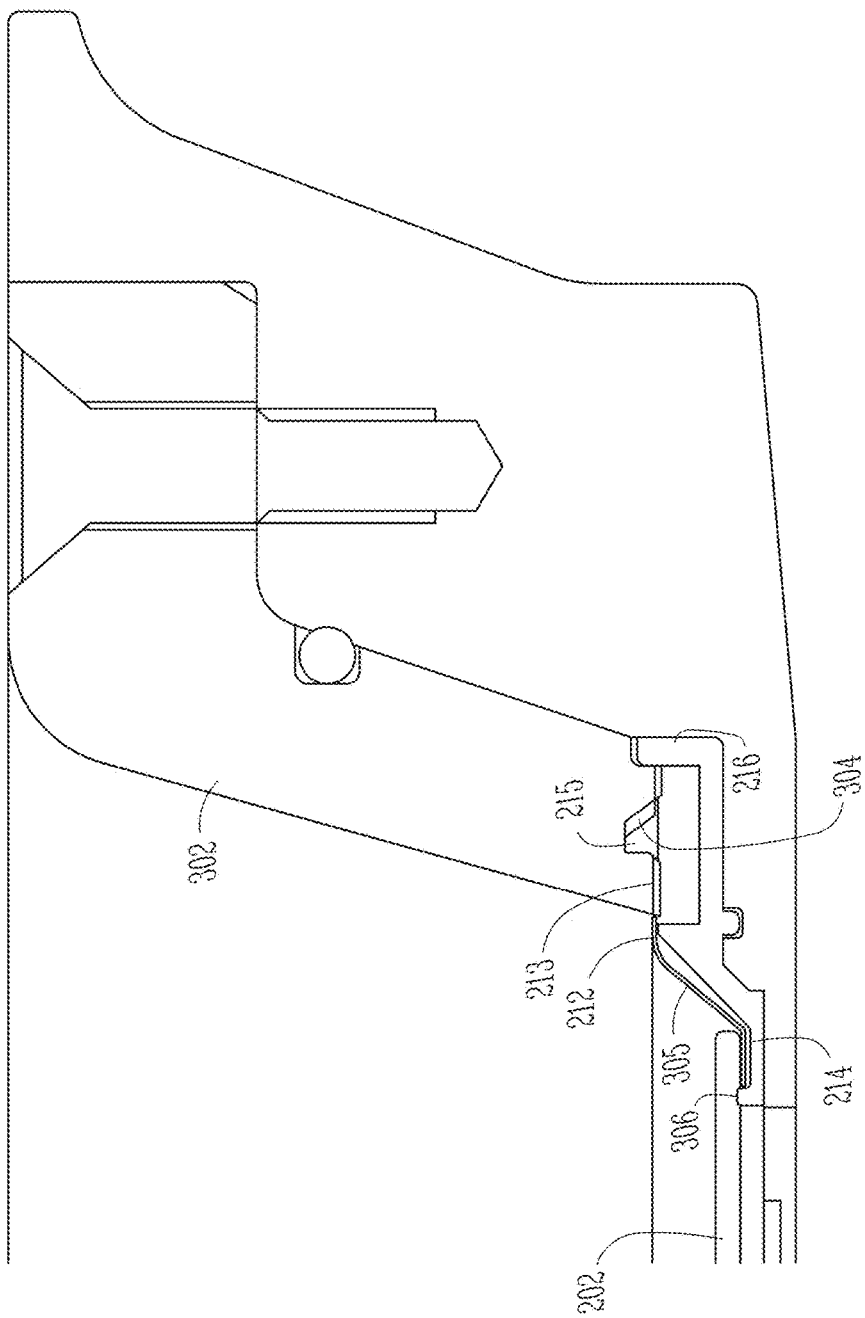
FIG. 3 illustrates a sectional view of an electroplating cup assembly 300 in accordance with one embodiment.

FIG. 3 illustrates a sectional view of an electroplating cup assembly 300 in accordance with one embodiment. The electrical contact structure 212 includes a continuous outer ring 213 that is positioned beneath and in contact with the bus ring 302 to allow uniform distribution of current from the bus ring 302. Further, the contact structure 212 includes a plurality of tabs 215 that extend upwardly from the outer ring 213 of the contact structure 212 into a groove 304 formed in the bus ring 302. The tab 215 contacts an inner edge of the groove 304. The tabs 215 are configured to center the electrical contact structure 212 in a correct location relative to the lip seal 216 and cup bottom 214 to ensure that all of the individual contacts (described below) on the electrical contact structure 212 touch the plating seed layer on a wafer 202 positioned in the cup bottom 214. Further, this feature also helps prevent any contacts from slipping past the lip seal 216 when a wafer is clamped into the electroplating cup assembly 300. The bus ring 302 may include the groove 304 that extends partially or fully around the bus ring 302, or may include two or more individual grooves that each accommodates one or more tabs.

The electrical contact structure 212 includes a plurality of contacts (e.g., 305, 306) that extend from the outer ring 213 toward a center of the electrical contact structure 212. Each contact includes a downward extending portion 305 that is spaced from the lip seal 216, and an upwardly turned up portion 306 configured to contact the wafer 202 positioned in the cup assembly. In this manner, each contact acts as a leaf spring that is pushed against the surface of a wafer 202 in the cup assembly with some spring force to ensure good contact between the contacts and the wafer 202. This allows the contacts to make good electrical contact with a wafer on either the bevel or the wafer surface. Therefore, this feature accommodates normal variations in the bevel position.

Figure 4:
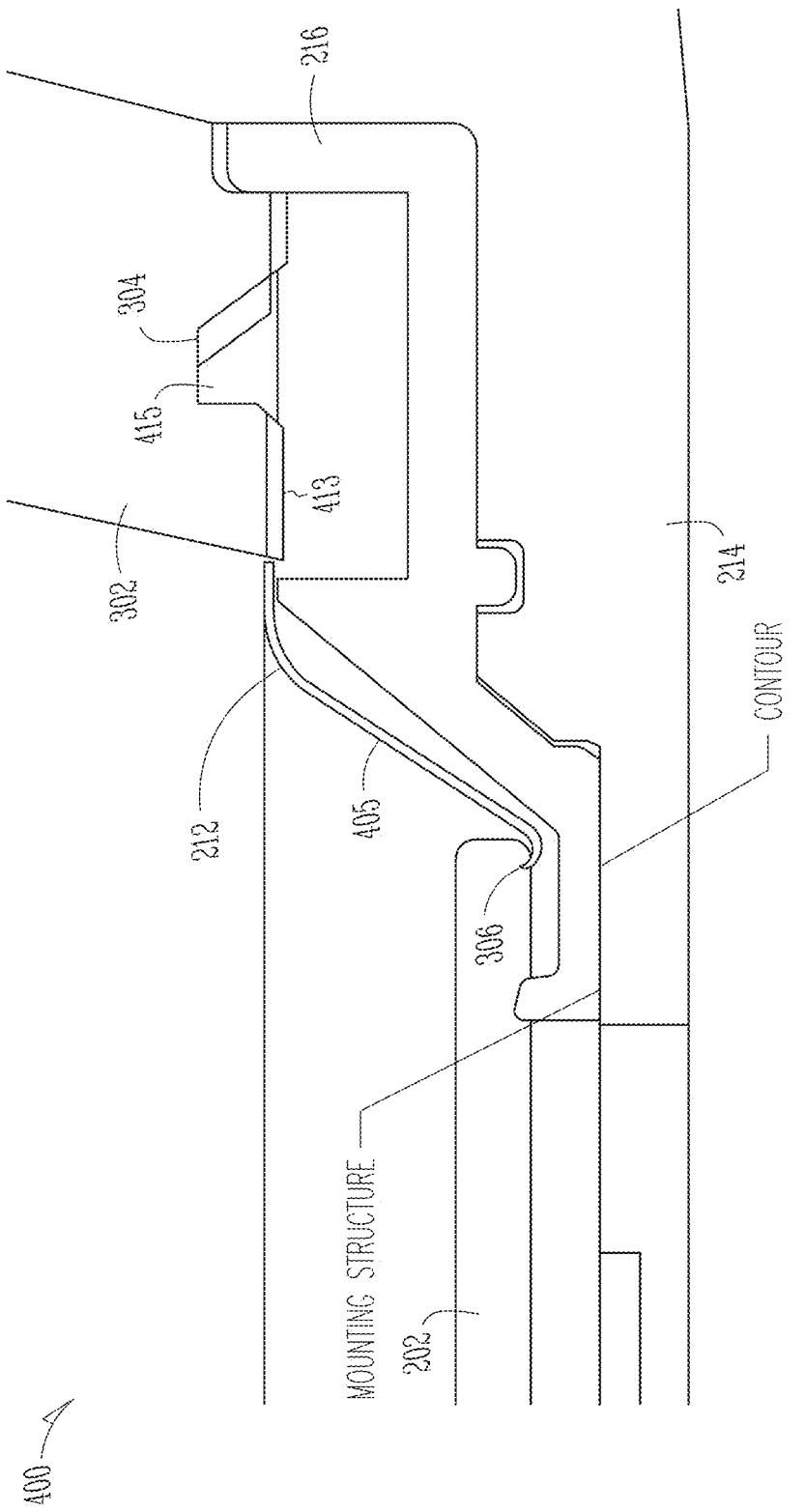
FIG. 4 illustrates a sectional view of electroplating cup assembly 400 in accordance with one embodiment.

FIG. 4 illustrates a sectional view of electroplating cup assembly 400 in accordance with one embodiment. The electrical contact structure 212 includes a continuous outer ring 413 that is positioned beneath and in contact with the bus ring 302 to allow uniform distribution of current from the bus ring 302. Further, the contact structure includes a plurality of tabs 415 that extend upwardly from the outer ring 413 of the contact structure into a groove 304 formed in the bus ring 302. The tab 415 contacts an inner edge of the groove 304. The tabs 415 are configured to center the electrical contact structure 212 in a correct location relative to the lip seal 216 and cup bottom 214 to ensure that all of the individual contacts (described below) on the electrical contact structure 212 touch the plating seed layer on a wafer 202 positioned in the cup bottom 214. Further, this feature also helps prevent any contacts from slipping past the lip seal 216 when a wafer is clamped into the electroplating cup assembly 300. The bus ring 302 may include the groove 304 that extends partially or fully around the bus ring 302, or may include two or more individual grooves that each accommodates one or more tabs.

The electrical contact structure 212 includes a plurality of contacts that extend from the outer ring toward a center of the electrical contact structure 212. Each contact includes a downward extending portion 405 that is spaced from the lip seal 216, and an upwardly turned up portion 306 configured to contact the wafer 202 positioned in the cup assembly. In this manner, each contact acts as a leaf spring that is pushed against the surface of a wafer in the cup with some spring force to ensure good contact between the contacts and the wafer. This allows the contacts to make good electrical contact with a wafer on either the bevel or the wafer surface. Therefore, this feature accommodates normal variations in the bevel position.

Figure 5:
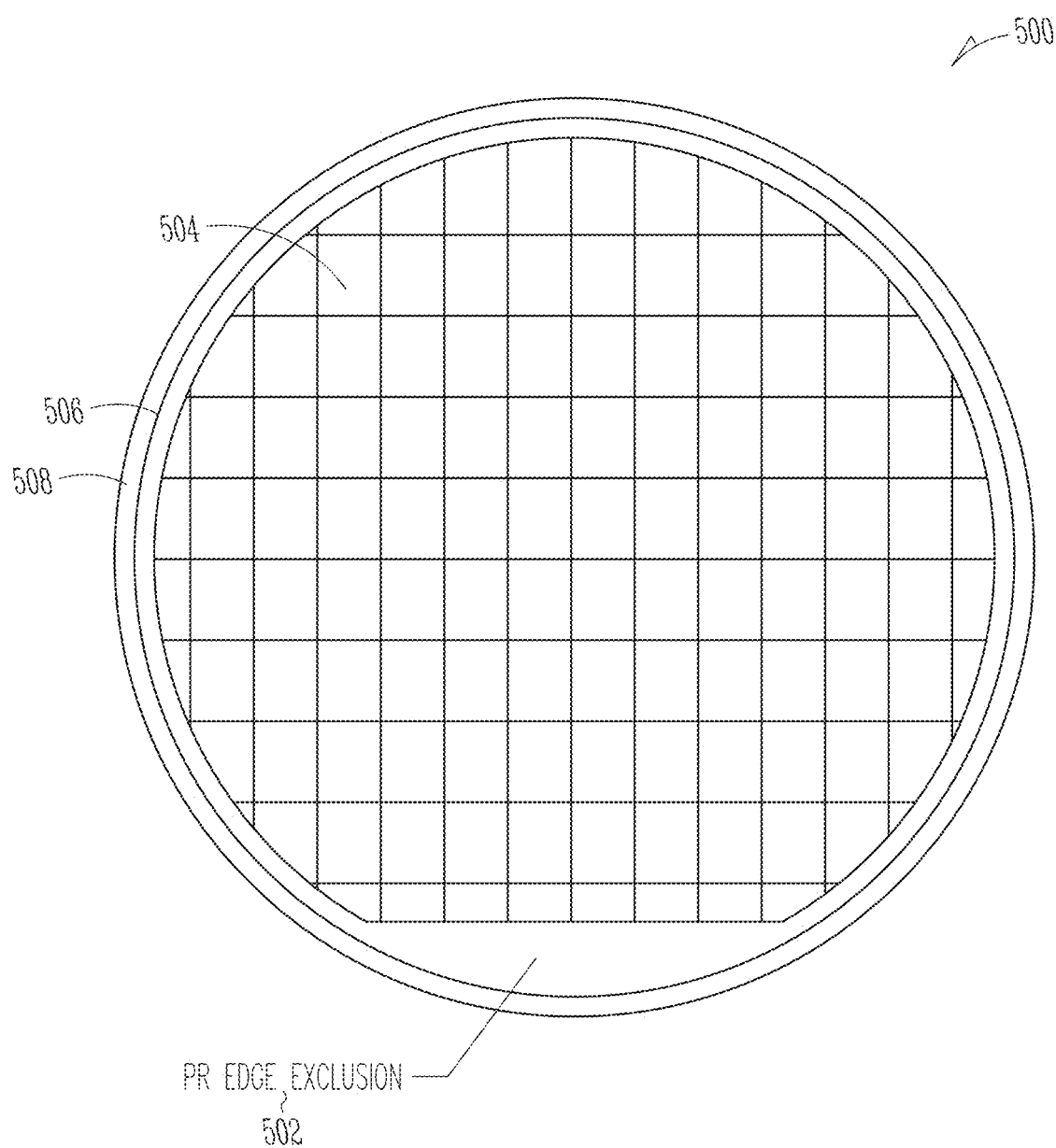
FIG. 5 illustrates a wafer 500 for use with the electroplating cup assembly 200 in accordance with one embodiment.

FIG. 5 illustrates a wafer 500 for use with the electroplating cup assembly 200 in accordance with one embodiment. The wafer 500 includes a PR Edge Exclusion 502, a patterned photoresist 504, a non-patterned photoresist 506, and an exposed copper seed area 508.

In a first embodiment, the presently described system targets thin-seed plating of Cu for RDL application: (1) any thin-seed (<1000 A) through-resist Cu plating application, not specifically RDL and (2) Nominal seed thickness (1000 A to 3000 A) with large pattern exclusion (large pattern exclusion is defined here as a region at the edge of the wafer larger than 0.5 mm in width where photoresist has been applied, but not patterned. Photoresist that is not patterned will not be plated and thus regions of pattern adjacent to large regions of non-pattern tend to plate with an abrupt thickness spike and thus and edge-uptick is formed).

In a second embodiment, the present application processes sacrificial plating and removes any metal (Ni, SnAg, Sn, Co). The EBR process is modified from a piranha etch (which is used for Cu etching in the first embodiment) to a nitric etch or other chemical etch tailored to the metal that will be etched.

Figure 6:
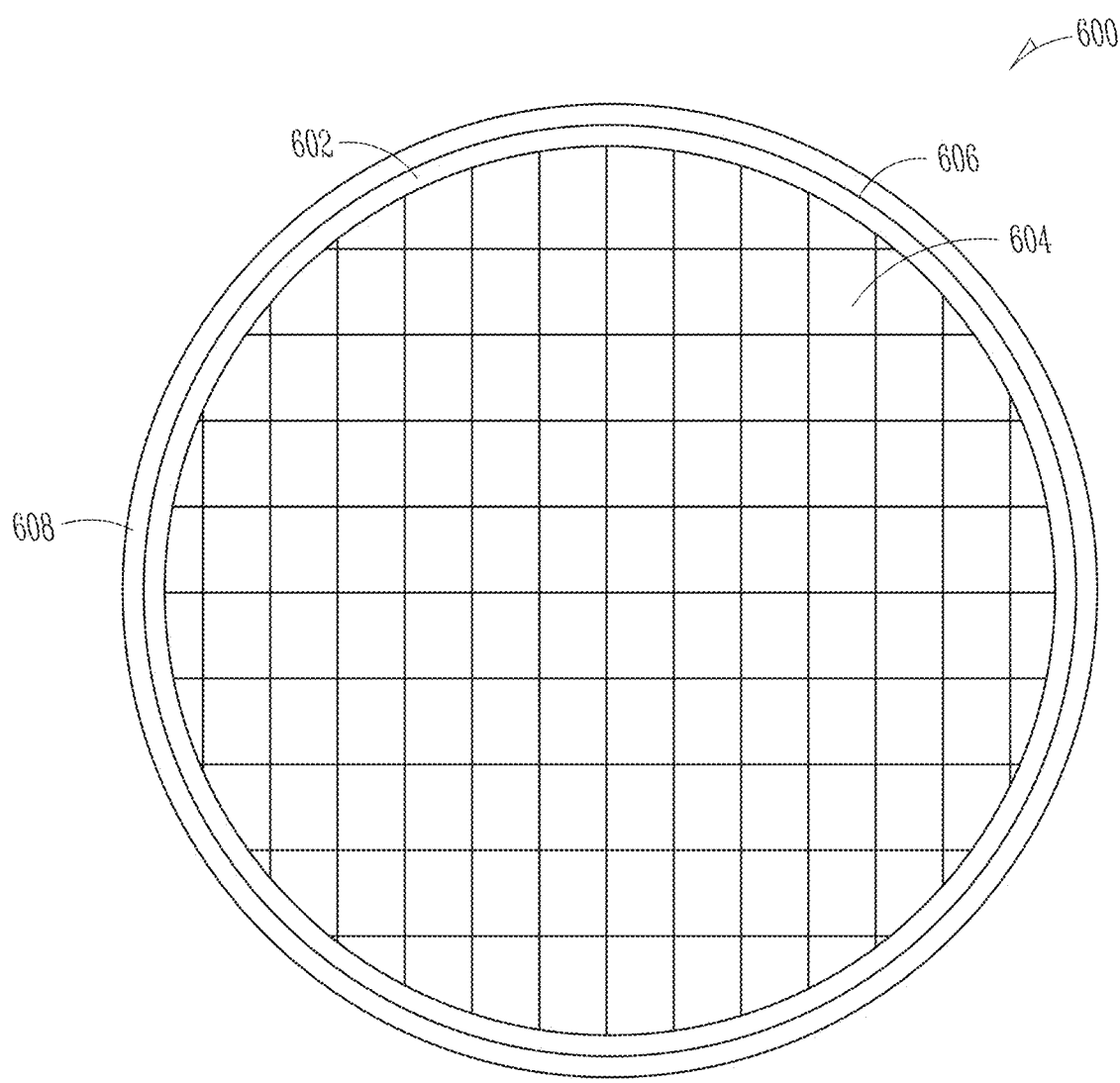
FIG. 6 illustrates a wafer 600 for use with the electroplating cup assembly 200 in accordance with one embodiment.

FIG. 6 illustrates a wafer 600 for use with the electroplating cup assembly 200 in accordance with one embodiment. The wafer 600 includes a pattern edge exclusion 602, a patterned photoresist area 604, a non-patterned photoresist area 606, and an exposed copper seed area 608. The wafer 600 does not include a PR edge exclusion region (as illustrated in FIG. 5).

Figure 7:
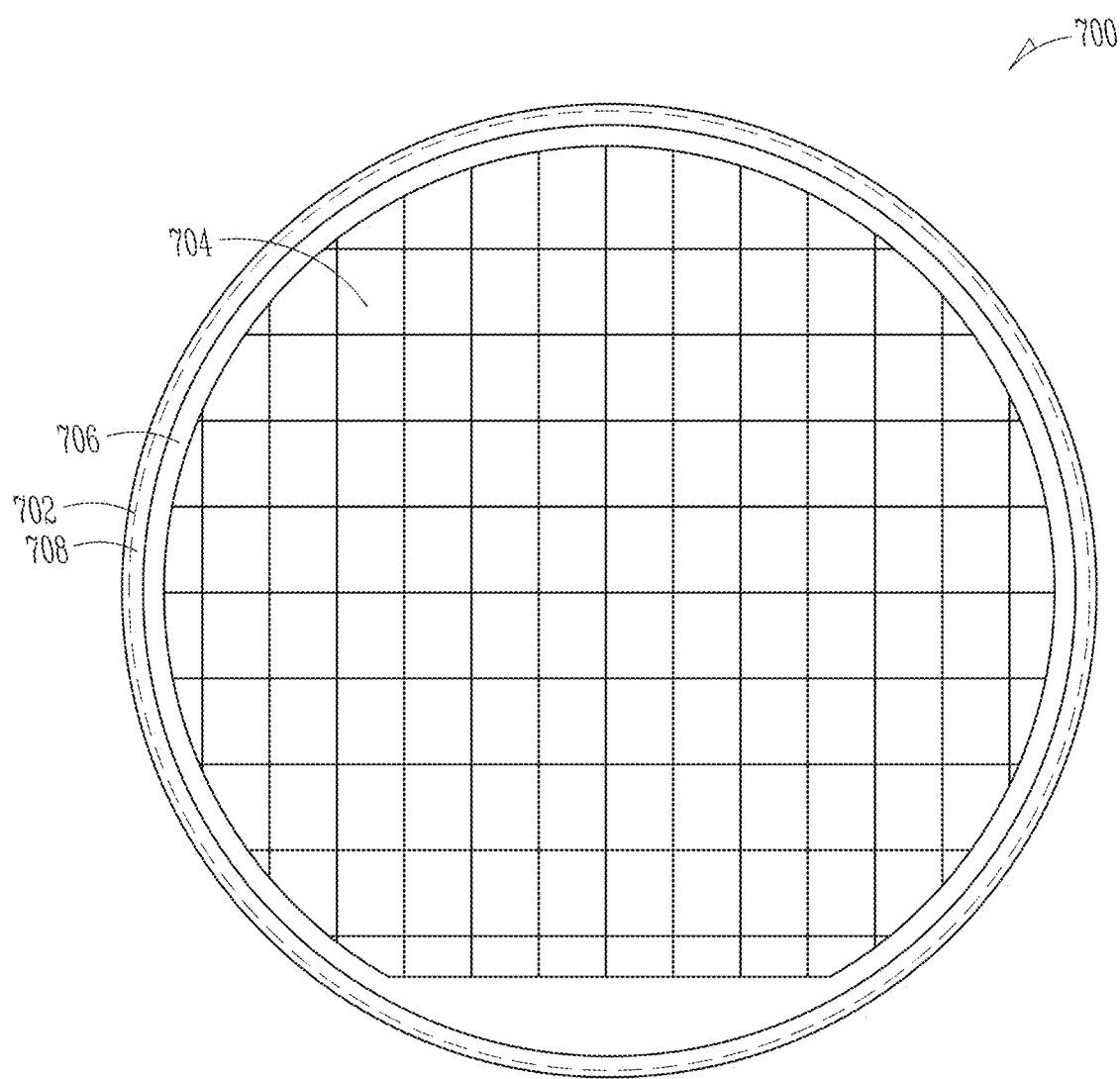
FIG. 7 illustrates a wafer 700 for use with the electroplating cup assembly 200 in accordance with one embodiment.

FIG. 7 illustrates a wafer 700 for use with the electroplating cup assembly 200 in accordance with one embodiment. The wafer 700 includes a seal 702, a patterned photoresist area 704, a non-patterned photoresist area 706, and a sacrificial layer area 708.

In this example embodiment, the seal 702 is formed with the contact of the lip seal 216. The seal 702 forms a substantially concentric seal where the sacrificial layer area 708 is plated around the entire periphery of the PR edge exclusion zone (e.g., PR Edge Exclusion 502).

Figure 8:
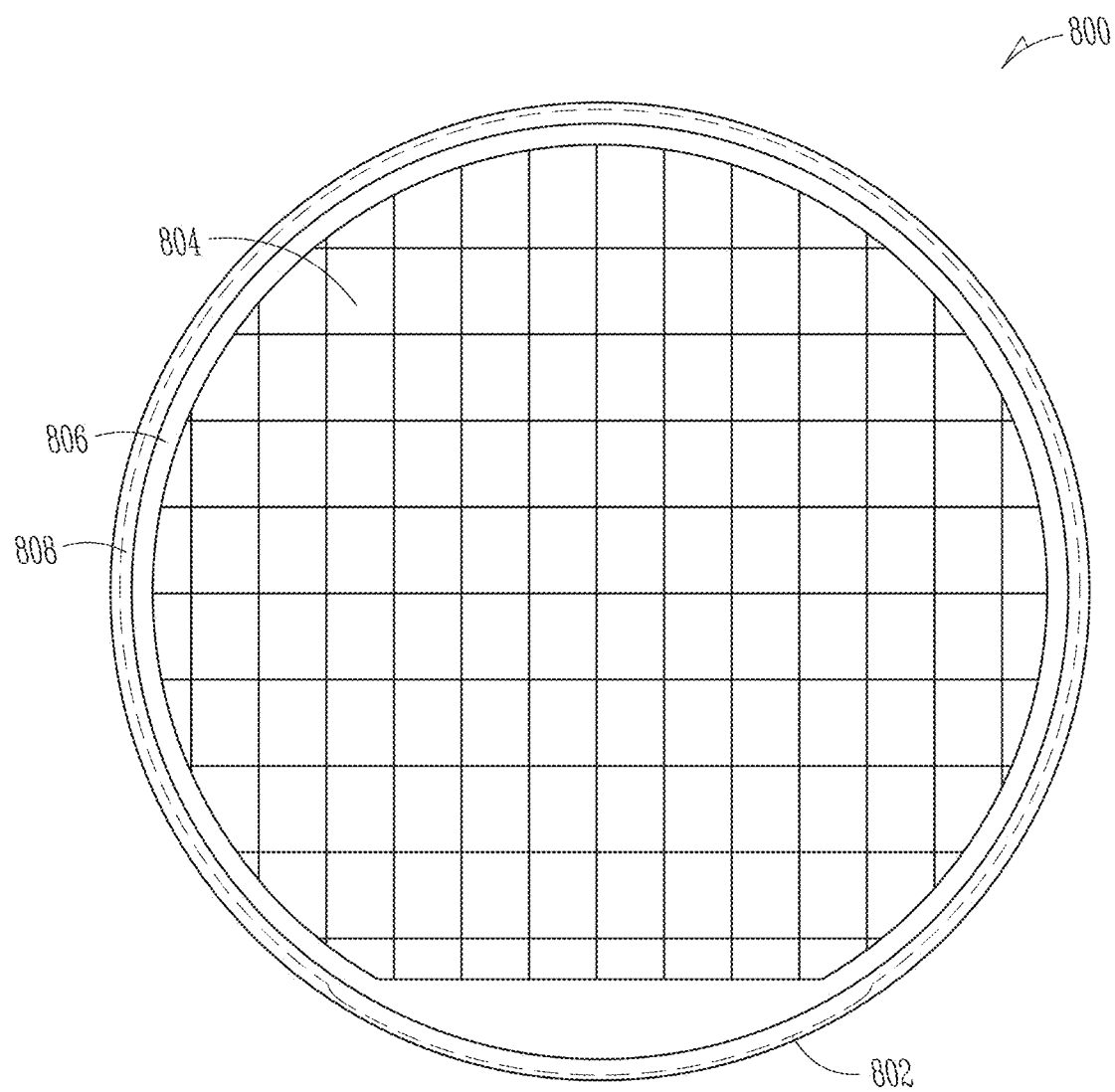
FIG. 8 illustrates a wafer 800 for use with the electroplating cup assembly 200 in accordance with one embodiment.

FIG. 8 illustrates a wafer 800 for use with the electroplating cup assembly 200 in accordance with one embodiment. The wafer 800 includes a seal 802, a patterned photoresist layer 804, a non-patterned photoresist area 806, and a sacrificial layer area 808.

In this example embodiment, the seal 802 is formed with the contact of the lip seal 216. The seal 802 forms a substantially concentric seal where the sacrificial layer area 808 is plated around the entire periphery of the PR edge exclusion zone (e.g., PR Edge Exclusion 502).

Furthermore, the seal 802 is designed to increase the sacrificial plating area in preferred azimuthal regions. For example, the azimuthal regions include regions that have larger patterned edge exclusion zone: "missing die" regions.

Figure 9:
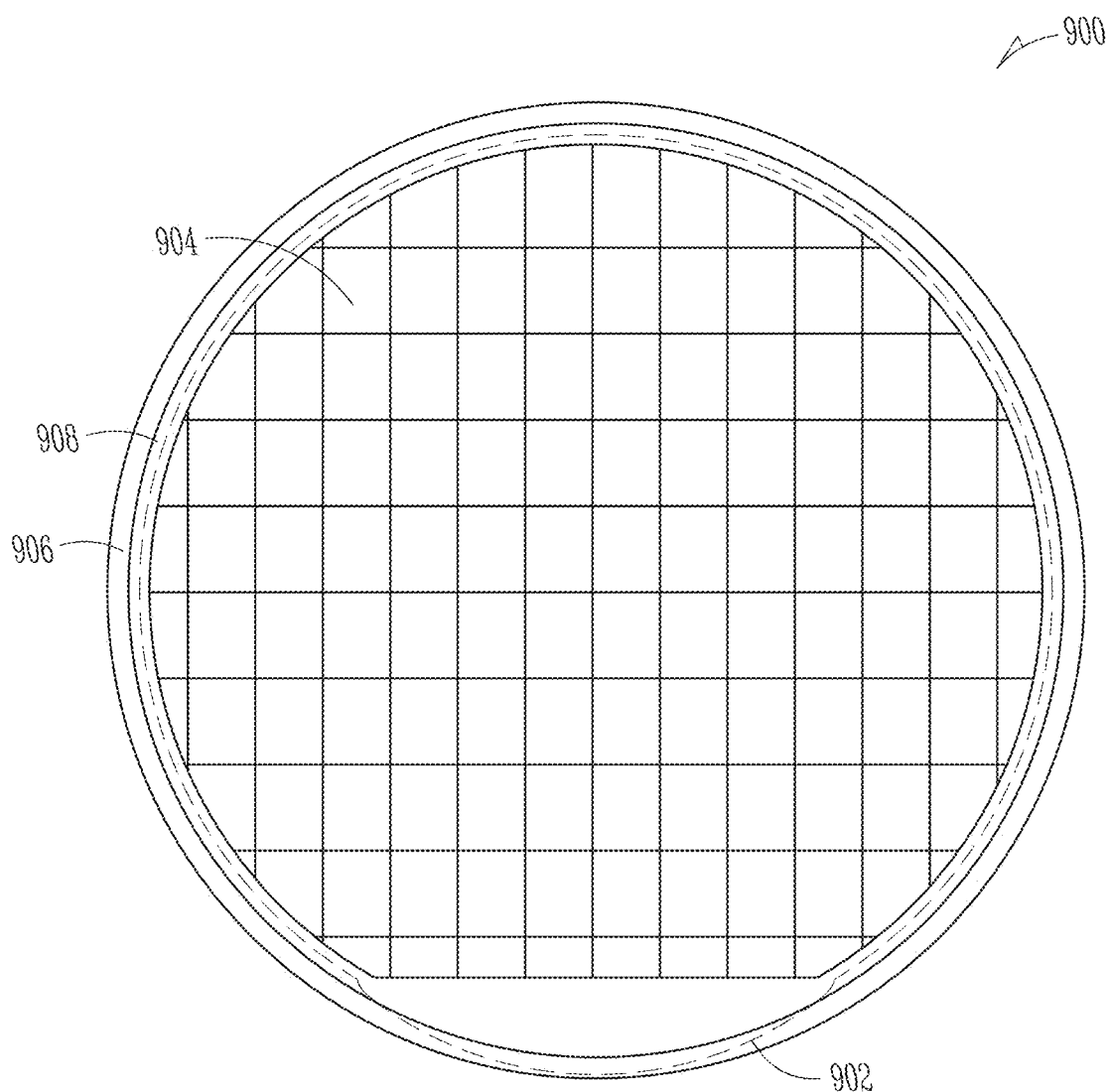
FIG. 9 illustrates a wafer 900 for use with the electroplating cup assembly 200 in accordance with one embodiment.

FIG. 9 illustrates a wafer 900 for use with the electroplating cup assembly 200 in accordance with one embodiment. The wafer 900 includes a seal 902, a sacrificial layer area 908, a patterned photoresist area 904, and a non-patterned photoresist area 906.

In this example embodiment, the seal 902 is formed with the contact of the lip seal 216. The seal 902 forms a substantially concentric seal where the sacrificial layer area 908 is plated around the entire periphery of the PR edge exclusion zone (e.g., PR Edge Exclusion 502).

Furthermore, the seal 902 is designed to increase the sacrificial plating area in preferred azimuthal regions. For example, the seal 902 is placed where only sacrificial copper is plated just outside the region adjacent to the "missing die" region.

The description above includes illustrative examples, devices, systems, and methods that embody the disclosed subject matter. In the description, for purposes of explanation, numerous specific details were set forth in order to provide an understanding of various embodiments of the disclosed subject matter. It will be evident, however, to those of ordinary skill in the art that various embodiments of the subject matter may be practiced without these specific details. Further, well-known structures, materials, and techniques have not been shown in detail, so as not to obscure the various illustrated embodiments.

As used herein, the term "or" may be construed in an inclusive or exclusive sense. Further, other embodiments will be understood by a person of ordinary skill in the art upon reading and understanding the disclosure provided. Further, upon reading and understanding the disclosure provided herein, the person of ordinary skill in the art will readily understand that various combinations of the techniques and examples provided herein may all be applied in various combinations.

Although various embodiments are discussed separately, these separate embodiments are not intended to be considered as independent techniques or designs. As indicated above, each of the various portions may be interrelated and each may be used separately or in combination with other particulate matter sensor calibration system embodiments discussed herein.

Consequently, many modifications and variations can be made, as will be apparent to the person of ordinary skill in the art upon reading and understanding the disclosure provided herein. Functionally equivalent methods and devices within the scope of the disclosure, in addition to those enumerated herein, will be apparent to the skilled artisan from the foregoing descriptions. Portions and features of some embodiments may be included in, or substituted for, those of others. Such modifications and variations are intended to fall within a scope of the appended claims. Therefore, the present disclosure is to be limited only by the terms of the appended claims, along with the full scope of equivalents to which such claims are entitled. It is also to be understood that the terminology used herein is for the purpose of describing particular embodiments only and is not intended to be limiting.

The Abstract of the Disclosure is provided to allow the reader to quickly ascertain the nature of the technical disclosure. The abstract is submitted with the understanding that it will not be used to interpret or limit the claims. In addition, in the foregoing Detailed Description, it may be seen that various features may be grouped together in a single embodiment for the purpose of streamlining the disclosure. This method of disclosure is not to be interpreted as limiting the claims. Thus, the following claims are hereby incorporated into the Detailed Description, with each claim standing on its own as a separate embodiment.

EXAMPLES

Example 1 includes an electroplating cup assembly comprising: a cup bottom with an opening configured to allow exposure of a wafer positioned in the electroplating cup assembly to an electroplating solution; a lip seal coupled to the cup bottom, the lip seal comprising a sealing structure that extends upwardly along an inner edge of the lip seal to a peak that is configured to be in contact with a seed layer of the wafer and a sacrificial layer of the wafer; and an electrical contact structure that forms a seal with the lip seal, the electrical contact structure configured to be coupled with the seed layer of at a perimeter of the wafer.

Example 2 includes example 1, wherein the peak is coupled to a wall of the sacrificial layer that is disposed along an annular region of the wafer.

Example 3 includes example 1, wherein the seed layer and the sacrificial layer comprises a copper seed layer.

Example 4 includes example 3, wherein the copper seed layer of the sacrificial layer has a thickness of less than 1000 Angstroms.

Example 5 includes example 3, wherein the copper seed layer of the sacrificial layer has a thickness between 1000 Angstroms and 3000 Angstroms with a pattern exclusion of at least 0.5 mm.

Example 6 includes example 1, wherein the cup bottom comprises a contour and wherein the seal comprises a mounting structure having a bottom surface configured to match the contour.

Example 7 includes example 1, wherein the cup bottom comprises an inner edge and wherein the inner cup edge of the cup bottom and the inner edge of the seal are axially aligned.

Example 8 is a method comprising: disposing a wafer on an electroplating cup assembly that exposes a surface of the wafer to an electroplating solution, the surface comprising a sacrificial layer at a perimeter of the wafer; electroplating the exposed surface of the wafer; and removing the plated sacrificial layer of the wafer after electroplating the exposed surface of the wafer.

Example 9 includes example 8, further comprising: wherein the sacrificial layer comprises an annular ring of seed layer.

Example 10 includes example 8, wherein removing the plated sacrificial layer comprises: applying an edge-bevel removal tool to the plated sacrificial layer.

Example 11 includes example 8, wherein removing the plated sacrificial layer comprises: etching the plated sacrificial layer from the wafer.

Example 12 includes example 8, wherein the electroplating cup assembly comprises: a cup bottom at least partially with an opening configured to allow exposure of the surface of the wafer positioned in the electroplating cup assembly to the electroplating solution; a lip seal coupled to the cup bottom, the lip seal comprising a sealing structure that extends upwardly along an inner edge of the lip seal to a peak that is configured to be in contact with a seed layer of the wafer and the sacrificial layer of the wafer; and an electrical contact structure that forms a seal with the lip seal, the electrical contact structure configured to be coupled with the seed layer of at the perimeter of the wafer.

Example 13 includes example 12, wherein the seed layer comprises one of a Cu, Ni, SnAg, Sn, or Co metal.

Example 14 is system comprising: a wafer with a seed layer and a sacrificial layer, the sacrificial layer being disposed along a perimeter of the wafer on the seed layer; and an electroplating cup assembly configured to support the wafer, the electroplating cup assembly comprising: a cup bottom at least partially defining an opening configured to allow exposure of the wafer positioned in the electroplating cup assembly to an electroplating solution; a lip seal coupled to the cup bottom, the lip seal comprising a sealing structure that extends upwardly along an inner edge of the lip seal to a peak that is configured to be in contact with the seed layer of the wafer and the sacrificial layer of the wafer; and an electrical contact structure that forms a seal with the lip seal, the electrical contact structure configured to be coupled with the seed layer of at the perimeter of the wafer.

Example 15 includes example 14, wherein the peak is coupled to a wall of the sacrificial layer that is disposed along an annular region of the wafer.

Example 16 includes example 14, wherein the seed layer and the sacrificial layer comprises a copper seed layer.

Example 17 includes example 16, wherein the copper seed layer of the sacrificial layer has a thickness of less than 1000 Angstroms.

Example 18 includes example 16, wherein the copper seed layer of the sacrificial layer has a thickness between 1000 Angstroms and 3000 Angstroms with a pattern exclusion of at least 0.5 mm.

Example 19 includes example 14, wherein the cup bottom comprises a contour and wherein the seal comprises a mounting structure having a bottom surface configured to match the contour.

Example 20 includes example 14, wherein the cup bottom comprises an inner edge and wherein the inner edge of the cup bottom and the inner edge of the seal are substantially axially aligned.

What is claimed is:

1. An electroplating cup assembly configured to support a wafer comprising:
    a cup bottom with an opening configured to allow exposure of the wafer positioned in the electroplating cup assembly to an electroplating solution, the wafer comprising a seed layer and a sacrificial layer disposed along a perimeter of the wafer on the seed layer;
    a lip seal coupled to the cup bottom, the lip seal comprising a sealing structure that extends upwardly along an inner edge of the lip seal to a peak that is configured to be in contact with a seed layer of the wafer and a sacrificial layer of the wafer; and
    an electrical contact structure that forms a seal with the lip seal, the electrical contact structure configured to be coupled with the seed layer of at a perimeter of the wafer.

2. The electroplating cup assembly of claim 1, wherein the peak is coupled to a wall of the sacrificial layer that is disposed along an annular region of the wafer.

3. The electroplating cup assembly of claim 1, wherein the cup bottom comprises a contour and wherein the seal comprises a mounting structure having a bottom surface configured to match the contour.

4. The electroplating cup assembly of claim 1, wherein the cup bottom comprises an inner cup edge and wherein the inner edge of the cup bottom and the inner edge of the seal are axially aligned.

5. The electroplating cup assembly of claim 1, wherein the seed layer and the sacrificial layer comprises a copper seed layer.

6. The electroplating cup assembly of claim 5, wherein the copper seed layer of the sacrificial layer has a thickness of less than 1000 Angstroms.

7. The electroplating cup assembly of claim 5, wherein the copper seed layer of the sacrificial layer has a thickness between 1000 Angstroms and 3000 Angstroms with a pattern exclusion of at least 0.5 mm, wherein the pattern exclusion being at an annular region of the wafer where photoresist having been applied.

8. A system comprising:
    a wafer with a seed layer and a sacrificial layer, the sacrificial layer being disposed along a perimeter of the wafer on the seed layer; and
    an electroplating cup assembly configured to support the wafer, the electroplating cup assembly comprising:
    a cup bottom at least partially defining an opening configured to allow exposure of the wafer positioned in the electroplating cup assembly to an electroplating solution;
    a lip seal coupled to the cup bottom, the lip seal comprising a sealing structure that extends upwardly along an inner edge of the lip seal to a peak that is configured to be in contact with the seed layer of the wafer and the sacrificial layer of the wafer; and
    an electrical contact structure that forms a seal with the lip seal, the electrical contact structure configured to be coupled with the seed layer of at the perimeter of the wafer.

9. The system of claim 8, wherein the peak is coupled to a wall of the sacrificial layer that is disposed along an annular region of the wafer.

10. The system of claim 8, wherein the cup bottom comprises a contour and wherein the seal comprises a mounting structure having a bottom surface configured to match the contour.

11. The system of claim 8, wherein the cup bottom comprises an inner edge and wherein the inner edge of the cup bottom and the inner edge of the seal are substantially axially aligned.

12. The system of claim 8, wherein the seed layer and the sacrificial layer comprises a copper seed layer.

13. The system of claim 12, wherein the copper seed layer of the sacrificial layer has a thickness of less than 1000 Angstroms.

14. The system of claim 12, wherein the copper seed layer of the sacrificial layer has a thickness between 1000 Angstroms and 3000 Angstroms with a pattern exclusion of at least 0.5 mm, wherein the pattern exclusion being at an annular region of the wafer where photoresist having been applied.

* * * * *